US008612166B2

(12) United States Patent
Schweiger et al.

(10) Patent No.: US 8,612,166 B2
(45) Date of Patent: Dec. 17, 2013

(54) TEST BED FOR ELECTRICAL ENERGY STORAGE SYSTEMS FOR VEHICLES

(75) Inventors: Mario Schweiger, Graz (AT); Stephan Kunzfeld, Graz (AT); Kurt Gschweitl, Eggersdorf (AT); Felix Pfister, Graz (AT); Franck Le Rhun, Graz (AT); Christian Schyr, Heidelberg (AT)

(73) Assignee: AVL List GmbH, Graz (AT)

( * ) Notice: Subject to any disclaimer, the term of this patent is extended or adjusted under 35 U.S.C. 154(b) by 248 days.

(21) Appl. No.: 12/656,537

(22) Filed: Feb. 2, 2010

(65) Prior Publication Data

US 2011/0153239 A1    Jun. 23, 2011

(30) Foreign Application Priority Data

Dec. 23, 2009   (AT) .................................. 822/2009 U

(51) Int. Cl.
*G01R 31/36*   (2006.01)
*G06F 19/00*   (2011.01)

(52) U.S. Cl.
USPC ............. 702/63; 180/65.1; 310/317; 702/44; 702/56; 702/121

(58) Field of Classification Search
USPC ........... 702/61, 63, 64, 65, 99, 119, 120, 121, 702/136, 183, 44, 56, 57, 60; 180/65.1; 307/10.1; 361/502; 429/9; 320/130; 310/317

See application file for complete search history.

(56) References Cited

U.S. PATENT DOCUMENTS

| 4,272,716 A | 6/1981 | Etienne |
| 5,241,233 A * | 8/1993 | Culp ............................ 310/317 |
| 7,461,728 B2 * | 12/2008 | Huston et al. ................ 188/378 |
| 2009/0139781 A1 * | 6/2009 | Straubel ...................... 180/65.1 |

FOREIGN PATENT DOCUMENTS

| EP | 1746402 | 1/2007 |
| JP | 2007292654 | 11/2007 |
| KR | 20050005694 | 1/2005 |

OTHER PUBLICATIONS

English translation JP2007292654.
English translation of KR20050005694.
English abstract of EP1746402.
www.green.autoblog.com/2009/12/17/video-watch-the-volt-battery-go-shake-shake-shake/.

* cited by examiner

*Primary Examiner* — John H Le
(74) *Attorney, Agent, or Firm* — Dykema Gossett PLLC

(57) ABSTRACT

A test bed for an electrical energy storage system for vehicles includes a test system for conducting electrical tests of the energy storage system, optionally at least one conditioning unit for the climate control of the energy storage system, at least one data collection and analysis system, and optionally at least one safety system. In order to be able to test energy storage systems in a manner approximating their use as closely as possible in that all real influences on the energy storage system, for example, a traction battery for electric or hybrid vehicles, can be simulated with the simultaneous interaction of thermal, electrical, and mechanical influencing factors without the need to conduct tests in a real-world environment, at least one actuator is additionally provided for the mechanical stimulation of the energy storage system.

10 Claims, 1 Drawing Sheet

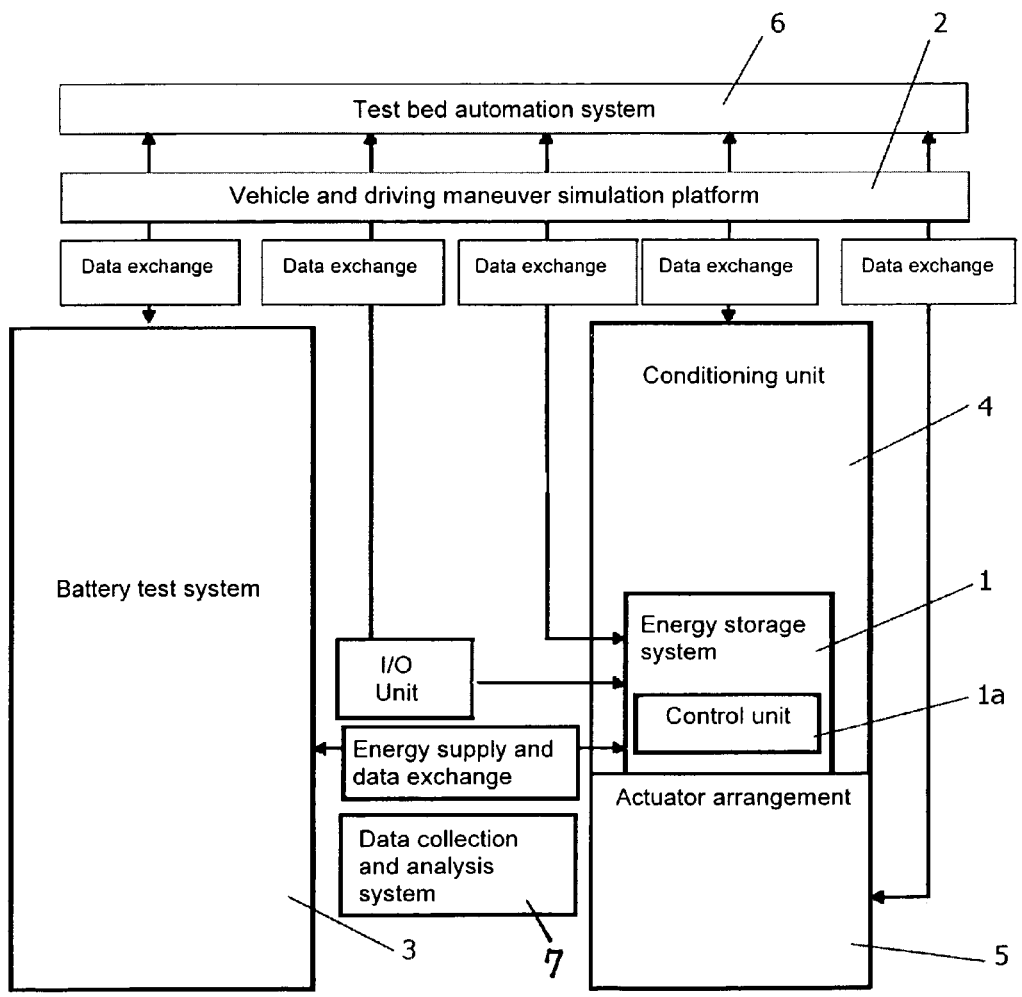

TEST BED FOR ELECTRICAL ENERGY STORAGE SYSTEMS FOR VEHICLES

BACKGROUND OF THE INVENTION

1. Field of the Invention

The invention relates to a test bed for electrical energy storage systems for vehicles, in particular for traction batteries for hybrid electric vehicles, plug-in hybrid electric vehicles, and electric vehicles, comprising a test system for conducting electrical tests of the energy storage system, optionally at least one conditioning unit for the climate control of the energy storage system, at least one data collection and analysis system and, optionally, at least one safety system.

2. The Prior Art

The most precise possible prediction of the behavior of electrical energy storage systems is of particular interest to the users of such systems. Therefore, it is in the interests of the manufacturers of electric or hybrid vehicles to obtain information in the development cycle as to how, for example, traction batteries behave in the vehicle with regard to various factors. The traction battery is subjected to variable electrical, thermal, and mechanical stresses, independently of the vehicle or the driving maneuver. The useful life, output, and safety of the battery are all determined by these special stresses. Therefore, it is important for these factors to be taken into account in the development of traction batteries and for their effects to be determined by means of suitable test methods that closely approximate real-world conditions.

Various standardized tests are used to characterize traction batteries; these tests describe thermal and electrical load profiles, but leave influences related to the vehicle and driving maneuvers largely unaccounted for. In order to be able to incorporate these influences in the form of test runs on the test bed, the thermal-electrical load profiles of the traction batteries are recorded using specially equipped test vehicles. These profiles are translated into test runs, which are then conducted on the test bed. In so doing, the influence of electrical and thermal factors is investigated at the same time; in rare cases, electrical and mechanical tests are combined.

Test bed solutions for, in particular, "virtual fleet trials" of "virtual vehicles" on "virtual test tracks" in "virtual driving maneuvers" providing simulation of thermal, electrical, and mechanical stimuli are currently not available. In the current development and manufacturing process, traction batteries with a battery management system are tested on test beds that usually comprise a battery test system having a battery tester, a control computer and automation system for conducting electrical tests, and at least one conditioning unit for climate control of the battery, at least one data collection and analysis system and, advantageously, at least one safety system. Electrical and/or thermal and/or combined electrical and thermal stress tests are performed on batteries using these test beds. Thus, for example, KR20050005694A discloses an arrangement by means of which battery systems may be tested in real time. Here, a vehicle simulation is coupled to a battery test system by means of which preset electrical and thermal values are calculated which are then implemented on the test bed.

SUMMARY OF THE INVENTION

Based on the above, the object of the present invention is a test bed on which energy storage systems may be tested in a manner approximating their application as closely as possible, in that all real influences on the energy storage system, for example, a traction battery for electric or hybrid vehicles may be reproduced with the simultaneous interaction of thermal, electrical, and mechanical influencing factors, without the need for conducting tests in a real environment.

In order to attain this object, the test bed according to the invention is characterized in that at least one actuator is provided for the mechanical stimulation of the energy storage system. By the cooperation of this or each such actuator, the test specimen may be stimulated thermally, electrically, and mechanically at the same time and as part of one single test run, in order to be able to replicate as closely as possible stresses that occur in real-world situations.

According to an advantageous embodiment of the invention, a test bed automation system is provided which controls the at least one actuator in order to specify the mechanical loads on the energy storage system. In this manner, a predetermined or precalculated course of mechanical stress values may be run in an automatic fashion.

Advantageously, this embodiment is also characterized in that the test bed automation system additionally controls the test system for conducting electrical tests and/or the conditioning unit and preferably comprises an energy storage control unit such as, for example, a battery management system. Thus, a predetermined and/or precalculated sequence of all electrical, thermal, and mechanical load values may be run and the behavior of the tested energy storage system may be tested.

An additional advantageous embodiment of the invention provides a vehicle and driving maneuver platform which calculates the electrical, thermal, and mechanical load values for the energy storage system according to a simulation model and controls at least one or each of the actuators or the test bed automation system.

Here, the vehicle and driving maneuver simulation platform preferably also controls the test system for conducting electrical tests simultaneously with the mechanical actuators or the test bed automation system, and preferably the conditioning unit as well. In this manner, it is possible for the totality of all electrical, thermal, and even mechanical preset values for different driving maneuvers to be calculated and implemented in the test bed using this vehicle and driving maneuver simulation platform, thus making the test bed into a "virtual test track."

The invention shall be described in greater detail in the description below using several examples and with reference to the attached drawing.

DETAILED DESCRIPTION OF THE DRAWING

The drawing schematically depicts a preferred embodiment of a test bed according to the present invention and the mutual dependencies and connections of hardware and control systems.

DETAILED DESCRIPTION OF THE PREFERRED EMBODIMENT

A test bed according to the invention may be used for evaluating the behavior of traction batteries 1, for example, with the generation of traction battery load profiles approximating real-world conditions and the implementation thereof by the design of the test bed being possible by the integration of a computer-supported vehicle and driving maneuver simulator 2. The test bed is provided with a test system 3 for conducting electrical tests of the energy storage system 1, optionally at least one conditioning unit 4 for climate control of the traction battery 1, at least one data collection and analysis system 7, and optionally at least one safety system.

A mechanical stimulation (i.e., vibration) of the energy storage system 1 is possible via an actuator 5, such that loads occurring in real-world situations may be optimally simulated by combining thermal, electrical, and now also mechanical stimuli as a part of one single test run. The actuator or each of the actuators 5 for presetting mechanical loads on the traction battery 1 is advantageously controlled via a test bed automation system 6, by means of which a predetermined sequence of mechanical load values may be automatically run. The test system 3 for conducting electrical tests and/or the conditioning unit 4 are also preferably controlled by this test bed automation system 6, optionally also an energy storage control unit 1a such as, for example, a battery management system.

The electrical, thermal, and mechanical load values for the energy storage system 1 preferably originate from a preferably real-time vehicle and driving maneuver simulation platform 2 in which they are calculated according to a simulation model. This platform 2 then provides the values to be set at each time point of the test run to the automation system 6 and/or the actuator or each of the actuators 5. Here, the driving maneuver simulation platform 2, preferably simultaneously with the mechanical actuators 5 or the test bed automation system 6, also controls the test system 3 for conducting electrical tests, preferably also the conditioning unit 4, in order to generate load profiles that closely mimic real-world conditions.

The electrical and thermal operating condition of the energy storage system 1 is monitored by means of a battery control unit 1a (battery control unit BCU or battery management unit BMS) with regard to threshold values that are critical to operational safety. On the test bed, this control unit 1a is integrated as part of a real or virtual vehicle control network in the test run in a "closed loop" technique. Here, this control unit 1a serves as an electrical on-off switch for the energy storage system 1 per se, serves as an interface for capturing measurement data, defines the permissible temperatures for the respective operating point of the vehicle and/or energy storage unit, records these values, and defines the permissible charge and discharge currents for the respective operating point of the vehicle and/or energy storage unit, which would occur in a real vehicle in cooperation with the other control units of the vehicle. In context of the virtual vehicle, the battery control unit 1a exists in reality, whereas the other control units are a part of the vehicle simulation 2 as "software in the loop" models. Because mechanical stimulation on the traction battery 1 may lead to short circuits during the test run, the safety function of the battery control unit 1a becomes particularly significant because it is able to interrupt test runs if the state of the energy storage system 1 requires such an interruption.

By means of the test bed solution according to the invention and the implementation of vehicle and driving data on the test bed made possible there, it is also possible for different driving maneuvers with different vehicles to be set in a virtual fashion, with the energy storage system 1 being integrated as "hardware in the loop" ("battery in the loop").

In the virtual fleet trial, virtual vehicles are moved in a virtual environment, with the simulation system 2 realistically simulating the environment of the vehicle as a virtual test track. This simulation includes, among other things, climate conditions (e.g., ambient temperature of the vehicle), road conditions (e.g., road surface, road conditions such as ice, rain, and 3D street models including bumps, etc.), the type of driver (passive to aggressive), other objects in traffic, driving maneuvers (e.g., passing, moose test, parking), traffic signs (e.g., stop/start), etc. The virtual vehicle into which the real traction battery 1 is integrated is characterized by simulation of, among other things, the chassis, tires, transmission, any internal combustion engine, an electric motor and coupling, and other vehicle components. By means of the conditions provided in the simulation 2 such as, for example, road irregularities or driving maneuvers, the vibration profile acting on the vehicle or drive train may be simulated. These data are used for the mechanical stimulation of the energy storage system 1 by means of the actuator or each of the actuators 5.

As part of the drive train, the energy storage system is therefore placed under a mechanical load in addition to the electrical and thermal operating point at which it is found at each time point. The quality and quantity of the mechanical stimulation (=vibration profile) depending directly on the conditions of the road and the current driving maneuver, in addition to features relevant to the vehicle such as the suspension. As part of the drive train, the electric motor is also placed in oscillation, which leads to changes in its power input and output. These electrical power fluctuations also affect the energy storage system as feedback.

The invention claimed is:

1. A test bed for an electrical energy storage system for vehicles, comprising:
   a test system for conducting electrical tests of the energy storage system,
   a data collection and analysis system, and
   an actuator means for vibrating the energy storage system and for presetting mechanical loads during electrical tests.

2. The test bed according to claim 1, including a test bed automation system for controlling the actuator means in order to specify the mechanical loads on the energy storage system.

3. The test bed according to claim 2, wherein the test bed automation system additionally controls the test system for conducting electrical tests.

4. The test bed according to claim 3, wherein the test bed automation system integrates an energy storage system control unit.

5. The test bed according to claim 4, wherein the energy storage system control unit is a battery management system.

6. The test bed according to claim 1, including a vehicle and driving maneuver simulation platform that calculates the electrical, thermal, and mechanical load values for the energy storage system according to a simulation model and controls the actuator means or the test bed automation system.

7. The test bed according to claim 6, wherein the vehicle and driving maneuver simulation platform, simultaneously with the actuator means or the test bed automation system, also controls the test system for conducting electrical tests.

8. The test bed according to claim 1, wherein the electrical energy storage system is a traction battery for a vehicle from the group of hybrid electric vehicles, plug-in hybrid electric vehicles or electric vehicles, respectively.

9. The test bed according to claim 1, including at least one conditioning unit for climate control of the energy storage system.

10. The test bed according to claim 1, including at least one safety system.

* * * * *